United States Patent
Chiu et al.

(10) Patent No.: US 8,235,218 B2
(45) Date of Patent: Aug. 7, 2012

(54) SEALING APPARATUS WITH INTERLOCKING AIR INFLATION DEVICE FOR WAFER CARRIER

(75) Inventors: Chih-Ching Chiu, New Taipei (TW); Pao-Yi Lu, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 1 day.

(21) Appl. No.: 13/076,417

(22) Filed: Mar. 30, 2011

(65) Prior Publication Data
US 2011/0174389 A1    Jul. 21, 2011

Related U.S. Application Data

(63) Continuation-in-part of application No. 12/242,966, filed on Oct. 1, 2008.

(51) Int. Cl.
*B65D 85/00* (2006.01)
(52) U.S. Cl. .................................. 206/710; 206/711
(58) Field of Classification Search .......... 206/710–713; 220/232; 137/533.11, 533.15, 533.13, 533.19; 292/252
See application file for complete search history.

(56) References Cited

U.S. PATENT DOCUMENTS

| | | | |
|---|---|---|---|
| 4,335,075 A | 6/1982 | Kackos | |
| 4,457,325 A | 7/1984 | Green | |
| 4,546,897 A | 10/1985 | Maloy et al. | |
| 4,781,213 A | 11/1988 | Kilayko | |
| 4,804,086 A | 2/1989 | Grohrock | |
| 6,368,411 B2 | 4/2002 | Roberson et al. | |
| 6,390,145 B1 | 5/2002 | Okabe et al. | |
| 7,455,180 B2 | 11/2008 | Sumi et al. | |
| 2005/0077204 A1 | 4/2005 | Sumi et al. | |
| 2005/0252827 A1 | 11/2005 | Tieben et al. | |

OTHER PUBLICATIONS

U.S. Appl. No. 12/242,966, filed Oct. 1, 2008, USPTO Office Action Mailed Jul. 2, 2009.
Formal Response to the Jul. 2, 2009 Office Action, Filed Dec. 30, 2009.
U.S. Appl. No. 12/242,966, filed Oct. 1, 2008, USPTO Office Action Mailed Mar. 11, 2010.
Formal Response to the Mar. 11, 2010 Office Action, Filed Apr. 20, 2010.
U.S. Appl. No. 12/242,966, filed Oct. 1, 2008, USPTO Office Action Mailed Jul. 7, 2010.
Formal Response to the Jul. 7, 2010 Office Action, Filed Oct. 6, 2010.
U.S. Appl. No. 12/242,966, filed Oct. 1, 2008, USPTO Office Action Mailed Dec. 15, 2010.
Formal Response to the Dec. 15, 2010 Office Action, Filed Mar. 14, 2011.
U.S. Appl. No. 12/242,966, filed Oct. 1, 2008, USPTO Office Action Mailed Mar. 12, 2012.

*Primary Examiner* — J. Gregory Pickett
*Assistant Examiner* — Andrew Perreault (57) ABSTRACT

The present invention relates a sealing apparatus with interlocking air inflation device for wafer carrier and a sealing method thereof, wherein the sealing apparatus is disposed between a wafer container and a cover of a wafer carrier, used for sealing the cover and the wafer container when the cover is closed to the wafer container. The sealing apparatus comprises: at least one latch set, at least one interlocked cam, an air inflation sealing member, and at least one air intake/outtake valve, wherein the interlocked cam is adopted for connecting an interlocking device having an air inflation member, and the interlocking device can be used to drive the interlocked cam for making the latch set bolt the cover and the wafer container, and inflate the air inflation sealing member through the air inflation member thereof and the air intake/outtake valve in order to inflate and expand the air inflation sealing member.

7 Claims, 12 Drawing Sheets

SEALING APPARATUS WITH INTERLOCKING AIR INFLATION DEVICE FOR WAFER CARRIER

CROSS REFERENCE TO RELATED APPLICATIONS

This application is a continuation-in-part of co-pending U.S. patent application Ser. No. 12/242,966 for "SEALING APPARATUS OF WAFER CARRIER AND SEALING METHOD THEREOF" filed on Oct. 1, 2008, the content of which is hereby incorporated by reference in its entirety.

BACKGROUND OF THE INVENTION

1. Technical Field

The present invention relates to a sealing apparatus for a wafer carrier, and more particularly, to a sealing apparatus with interlocking air inflation device for a wafer carrier.

2. Description of Related Art

Generally, in order to avoid particle effect from affecting the normal operations of the wafer fabrication process and maintain a desired yield rate, the fabrication of the semiconductor wafer must be processed in a clean room with a very high level of cleanliness. Besides, in the clean room, a wafer carrier is used for storing and carrying semiconductor wafers, so as to avoid the semiconductor wafers from regularly exposing in the air, and prevent the semiconductor wafers from damage caused by an external force when the semiconductor wafers is shipped. Wherein the wafer carrier is conformed to the technology of Standard Mechanical Interface (SMIF) and the major benefit of such technology is to greatly reduce the requirement for a large-area clean room in the wafer fabrication process, and also lower the cost for the clean room and related equipments for maintaining a high level of clean air.

Figure 1:
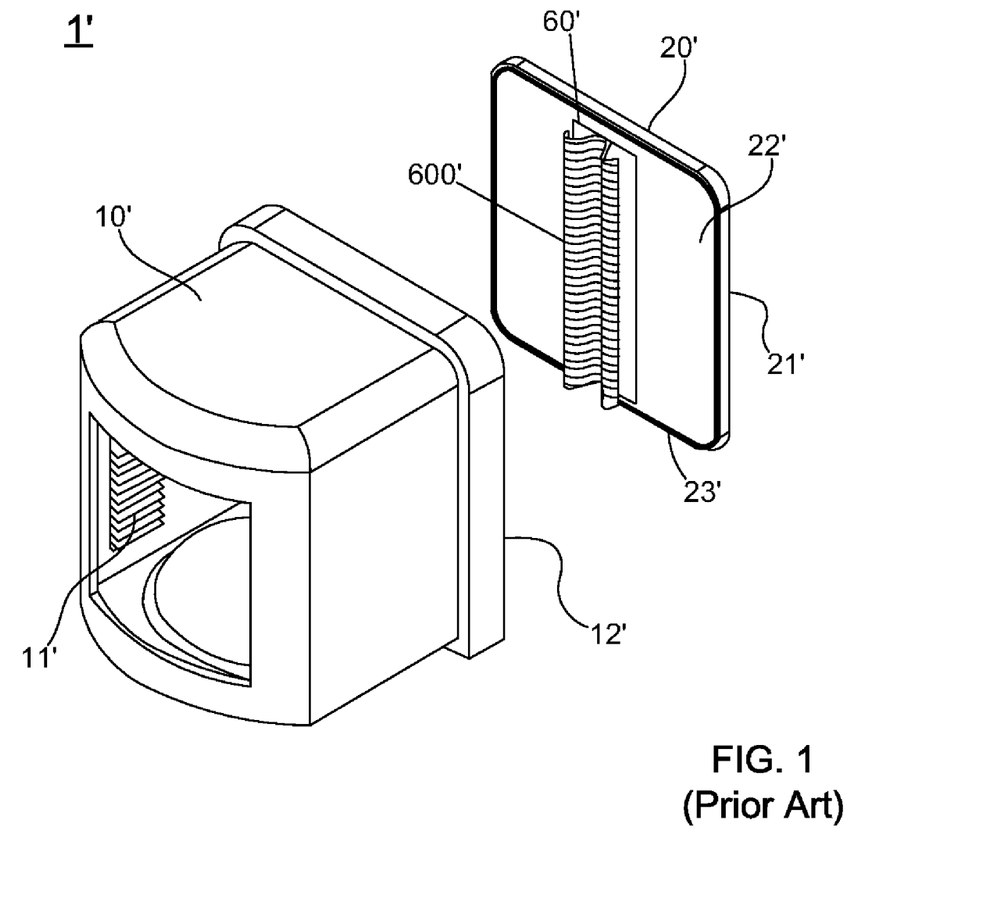
FIG. 1 is a stereo view of a conventional FOUP wafer carrier.

Moreover, with the progress of semiconductor process technology, 12-inch wafer factory is getting to become the major semiconductor wafer factory. In the 12-inch wafer factory, a Front Opening Unified Pod (FOUP) is used as the wafer carrier for storing and carrying the semiconductor wafers. Please refer to FIG. 1, which illustrates a stereo view of a conventional FOUP wafer carrier. As shown in FIG. 1, the FOUP wafer carrier 1' includes a wafer container 10' and a cover 20', wherein the wafer container 10' has a plurality of slots 11' adopted for accommodating a plurality of wafers, in addition, an opening 12' is formed in one side of the wafer container 10' for inputting and outputting the plurality of wafers.

Continuously referring to FIG. 1, the cover 20' includes an outer surface 21' and an inner surface 22', wherein at least one latch mechanism (not shown in FIG. 1) is disposed on the outer surface 21' of the cover 20', used to open or close the cover 20'. The inner surface 22' of the cover 20' has a wafer restricting module 60' with a plurality of wafer restricting members 600'. When the plurality of wafers are respectively put into the plurality of slots of the wafer container and the cover 20' is closed the wafer container 10', the restricting members 600' are able to respectively confine the wafers for preventing the wafers from moving toward the opening 12'; Moreover, an O-ring 23' is disposed around the edge of the inner surface 22', used for sealing the FOUP wafer carrier 1' when the cover 20' is closed the wafer container 10'.

Thus, through the above descriptions, it is able to know that the main elements of the conventional FOUP wafer carrier; moreover, according to the above descriptions, it can also understand that the constitution of the FOUP wafer carrier 1' is very simple, and the wafer restricting module 60' in the FOUP wafer carrier 1' can avoid wafers from moving toward and collide with the opening 12'. Therefore, for the FOUP wafer carrier 1' includes the above advantages, it is widely used in the current 12-inch wafer 12-inch wafer factory.

However, the conventional FOUP wafer carrier 1' still has an important drawback, that is, when the cover 20' is closed the wafer container 20', it is merely used the O-ring 23' to seal up the cover 20' and the wafer container 20', and Such sealing way is still inadequate for the FOUP wafer carrier 1'. Accordingly, in view of the conventional sealing apparatus used in the wafer carrier still has shortcomings and drawbacks, the inventor of the present application has made great efforts to make inventive research thereon and eventually provided a sealing apparatus with interlocking air inflation device for a wafer carrier

BRIEF SUMMARY OF THE INVENTION

The first objective of the present invention is to provide a sealing apparatus with interlocking air inflation device, used in a wafer carrier with a wafer container and a cover, so that, when the cover is closed the wafer container, an air inflation sealing member of the sealing apparatus would be inflated and expanded for assuredly sealing the wafer carrier.

The second objective of the present invention is to provide a sealing apparatus with interlocking air inflation device, used in a wafer carrier with a wafer container and a cover, moreover, at least one interlocked cam and at least one latch set are disposed between an inner surface and an outer surface of the cover, such that an interlocking device can be connected to the interlocked cam for driving the interlocked cam to rotate a specific angle, therefore the latch set may latch the cover and the wafer container; and simultaneously, an inflating gas is injected to the air inflation sealing member for expanding the air inflation sealing member.

Thus, in order to achieve the abovementioned first and second objectives, the inventor proposes a sealing apparatus with interlocking air inflation device, disposed in a wafer carrier having a wafer container and a cover, wherein the cover is used for closing and opening the wafer container, and the cover and the wafer container can be fastened together through a fastener mechanism, moreover, an opening is formed in one side of the wafer container, such that the sealing apparatus is disposed between the opening and the cover for sealing the wafer container and the cover, the sealing apparatus comprises:

at least one latch set, disposed between an inner surface and an outer surface of the cover;

at least one interlocked cam, disposed between the inner surface and the outer surface of the cover and connected to the at least one latch set, wherein the interlocked cam has a first connecting member;

an air inflation sealing member, disposed around the edge of the inner surface of the cover; and at least one air intake/outtake valve, coupled to the air inflation sealing member and capable of coupling to the first connecting member of the interlocked cam;

wherein the interlocked cam is adopted for connecting an interlocking device with an air inflation member, when the interlocking device is connected to the interlocked cam, the air inflation member couples to the air intake/outtake valve via the first connecting member;

wherein when the cover is closed the wafer container and the interlocking device is connected to the interlocked cam, the interlocking device can be used for driving the interlocked cam to forward rotate a specific angle, so as to make the latch set latch the cover and the wafer container, and meanwhile the air inflation member couples to the air intake/outtake valve through the first connecting member, therefore, an inflating gas is able to enter the air intake/outtake valve via the air inflation member and the interlocked cam, furthermore, the air intake/outtake valve may inflate the air inflation sealing member, so as to expand the air inflation sealing member;

wherein when the air inflation sealing member is inflatable and the interlocking device is connected to the interlocked cam, the air inflation member is able to extend an extension portion thereof and make the extension portion enter the air intake/outtake valve, therefore the extension portion is adopted for making the air intake/outtake valve deflate the air inflation sealing member, moreover, after the air inflation sealing member is deflated, the interlocked cam can be drive to reversely rotate the specific angle by the interlocking device for opening the latch set.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To more clearly describe a sealing apparatus with interlocking air inflation device for a wafer carrier according to the present invention, embodiments of the present invention will be described in detail with reference to the attached drawings hereinafter.

Figure 2:
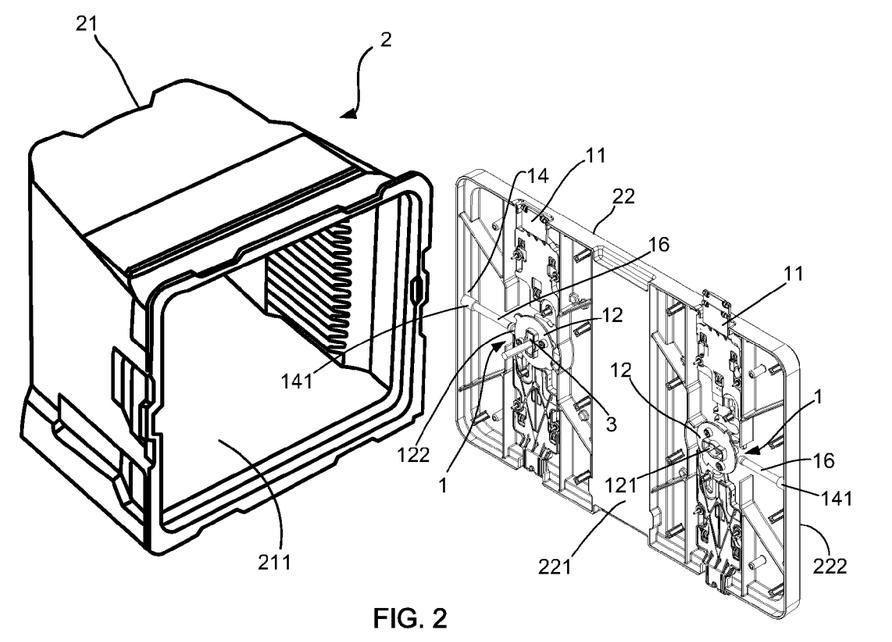
FIG. 2 is an exemplary framework of a sealing apparatus with interlocking air inflation device for a wafer carrier according to the present invention.
Figure 3:
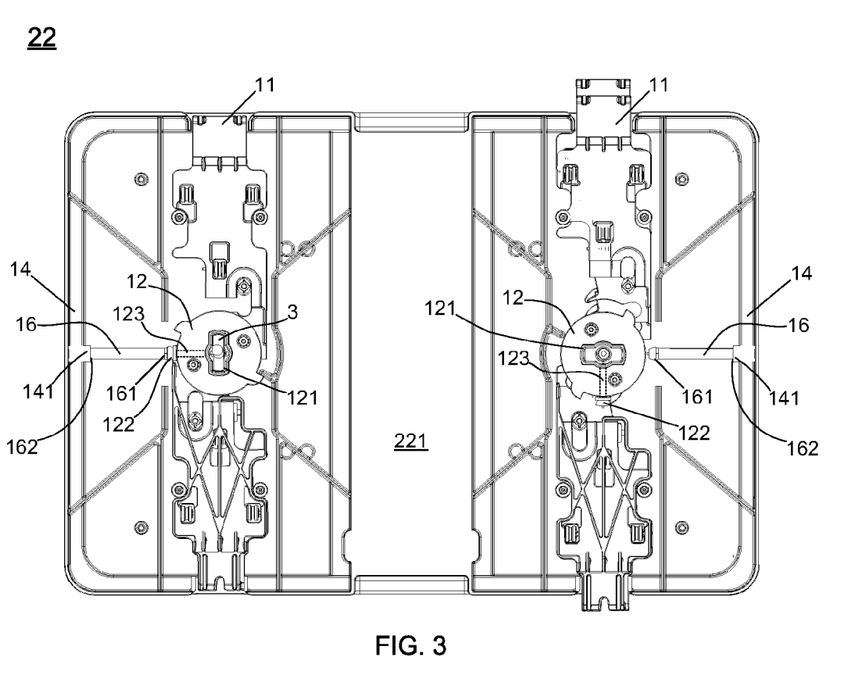
FIG. 3 is a front view of the sealing apparatus with interlocking air inflation device according to the present invention.
Figure 4:
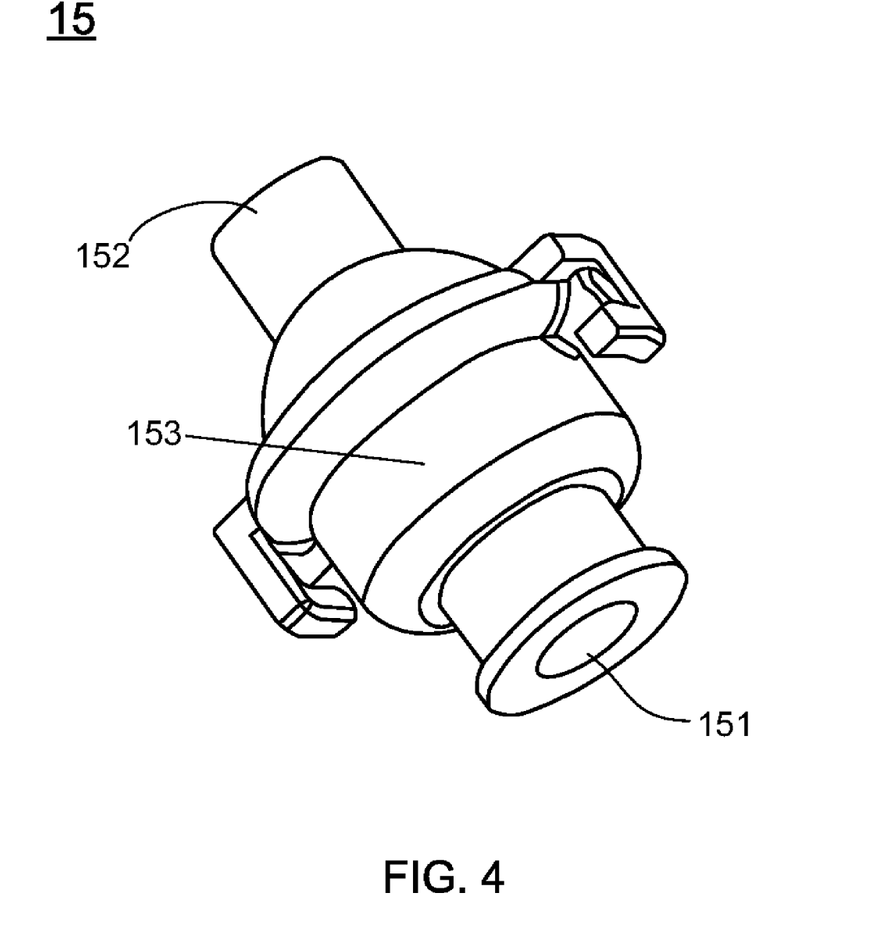
FIG. 4 is the stereo view of an air intake/outtake valve of the sealing apparatus with interlocking air inflation device according to the present invention.

Please refer to FIG. 2, which illustrates an exemplary framework of a sealing apparatus with interlocking air inflation device for a wafer carrier according to the present invention; moreover, please refer to FIG. 3 and FIG. 4, which illustrate a front view of the sealing apparatus with interlocking air inflation device and the stereo view of an air intake/outtake valve in the sealing apparatus, respectively. As shown in FIG. 2, generally, a wafer carrier 2 includes a wafer container 21 and a cover 22, wherein the cover 22 is used to close and open the wafer container 21, in addition, the wafer container 21 and the cover 22 can be fastened together by way of a fastening mechanism. Moreover, an opening 211 is formed in one side of the wafer container 21, and the sealing apparatus 1 is disposed between the opening 211 and the cover 22 for sealing the wafer container 21 and the cover 22, the sealing apparatus 1 includes: two latch sets 11, two interlocked cams 12, an air inflation sealing member 14, two air intake/outtake valves 15 (the air intake/outtake valve 15 is not shown in FIGS. 2, 3 and 4), and two connecting rubber tubes 16.

Continuously referring to FIG. 2, FIG. 3 and FIG. 4, the two latch sets 11 are disposed between an inner surface 221 and an outer surface 222 of the cover 22, used for latching the wafer container 21 and the cover 22 when the cover 22 is closed the wafer container 21. The two interlocked cams 12 are disposed between the inner surface 221 and the outer surface 222 of the cover 22, and connected to the two latch sets 11, respectively; moreover, as shown in FIG. 2 and FIG. 3, the interlocked cam 12 has a first connecting member 122, adopted for connecting the connecting rubber tube 16; an accommodating portion 121, formed in the center of the interlocked cam 12, and used for connecting and accommodating the interlocking device 3; and a flow channel 123, which is disposed inside the interlocked cam 12 and connects with the accommodating portion 121 and the first connecting member 122.

The manufacturing material of the air inflation sealing member 14 can be a polyolefin thermoplastic elastomer, a polyester thermoplastic elastomer or a rubber, and it is disposed around the edge of the inner surface 221 of the cover 22, and includes a second connecting member 141, wherein the second connecting member 141 is a rubber tube. The connecting rubber tube 16 has a first end 161 and a second end 162. As shown in FIG. 3, the first end 161 accommodates the air intake/outtake valve 15 and is used for connecting the first connecting member 12, the second end 162 is connected to the air inflation sealing member 14. As shown in FIGs., since the first connecting member 122 is a circular body, the first end 161 is fully accommodated and covered by the first connecting member 122 when it is connected to the first connecting member 122; On the other hand, the second end 162 is disposed in the second connecting member 141 of the air inflation sealing member 14.

Figure 5:
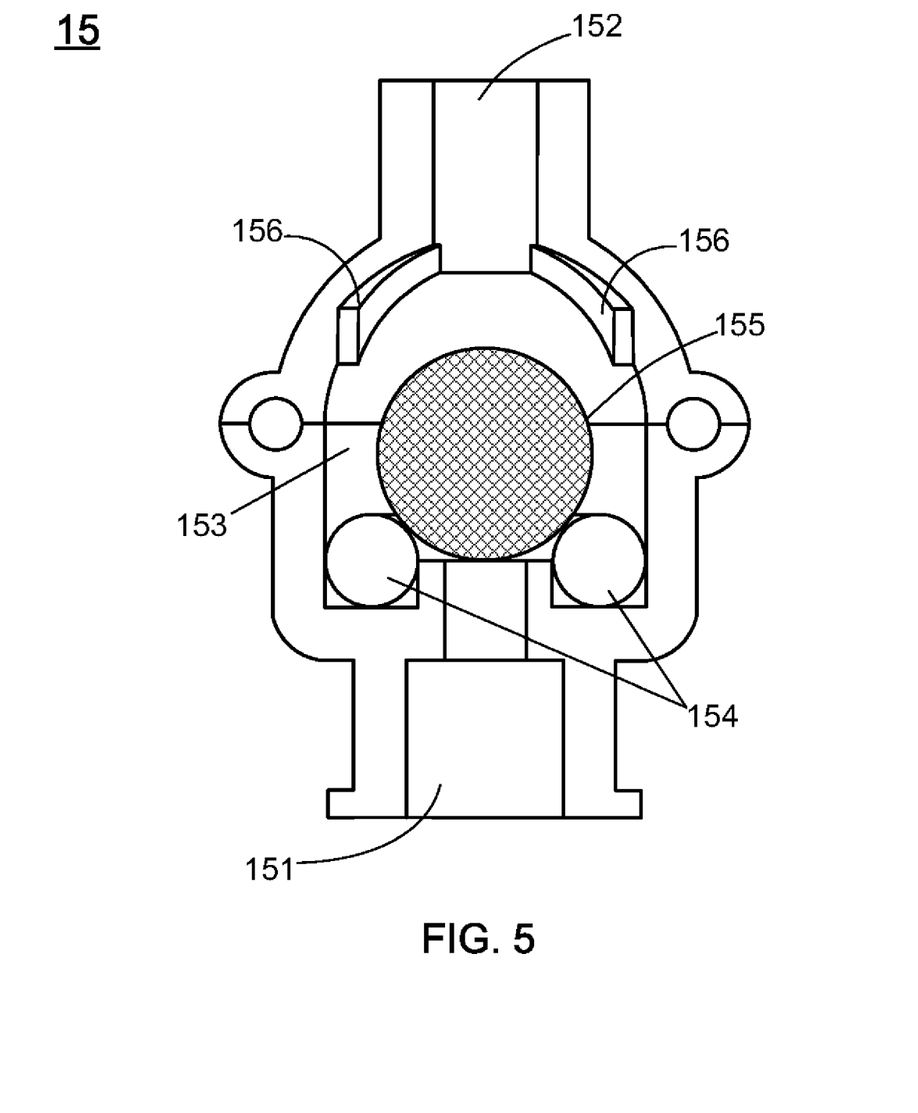
FIG. 5 is a section view of an air intake/outtake valve of the sealing apparatus with interlocking air inflation device according to the present invention.

Referring to FIG. 2, FIG. 3 and FIG. 4 again, and simultaneously referring to FIG. 5, which illustrates a section view of the air intake/outtake valve of the sealing apparatus with interlocking air inflation device according to the present invention. As shown in FIG. 5, the air intake/outtake valve 15 includes a first air passage 151, a central chamber 153, an O-ring 154, a sealing ball 155, a second air passage 152, and a plurality of ribs 156, wherein the first air passage 151 is able to couple the flow channel 123 for making the inflating gas provided by the air inflation member 31 enter the first air passage 151 via the flow channel 123. The central chamber 153 is connected to the first air passage 151; The O-ring 154 is disposed in the central chamber 153 and located at the connecting junction of the central chamber 153 and the first air passage 151; The sealing ball 155 is disposed in the central chamber 153 and located over the O-ring 154; Moreover, The second air passage 152 is connected to the central chamber 153 and opposite to the first air passage 151, used for coupling to the air inflation sealing member 14; The plurality of ribs 156 are disposed in the central chamber 153 and located at the connecting junction of the central chamber 153 and the second air channel 152, besides, an air-guiding passage is formed between any two adjacent ribs 156.

Figure 6A:
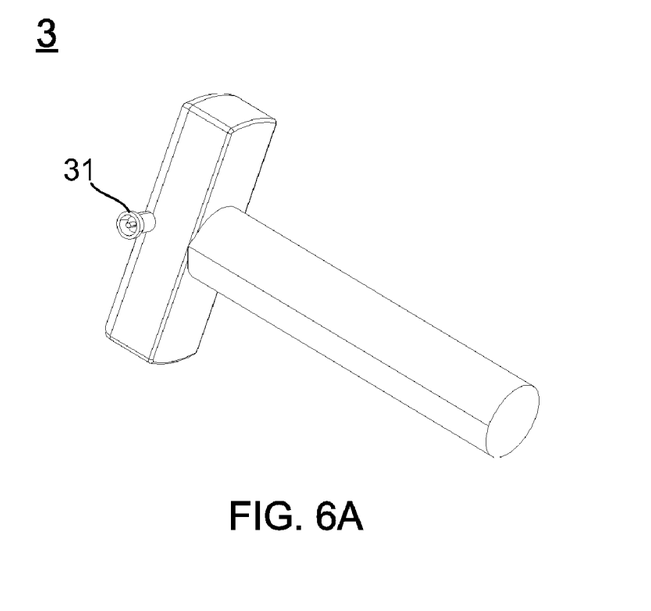
FIG. 6A and FIG. 6B are the stereo views of an interlocking device of the sealing apparatus according to the present invention.
Figure 6B:
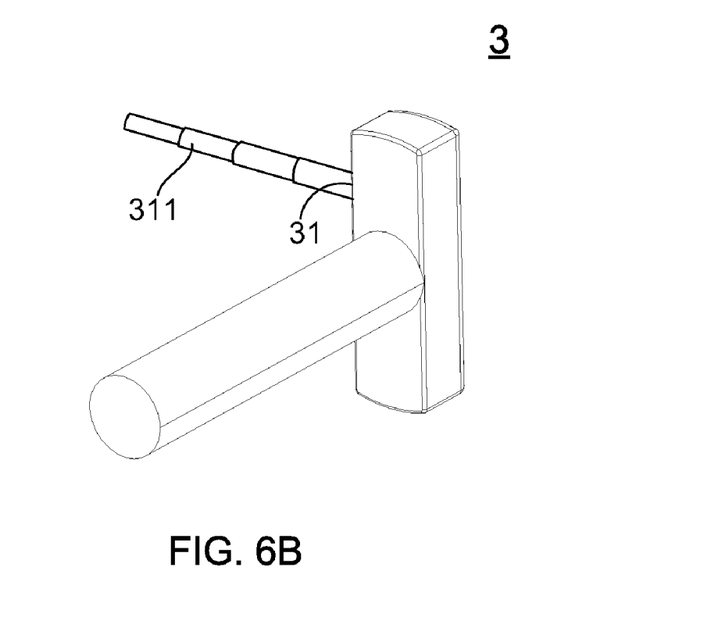

Referring to FIG. 2, FIG. 3, FIG. 4, and FIG. 5 again, and simultaneously referring to FIG. 6A and FIG. 6B, which illustrate the stereo views of the interlocking device of the sealing apparatus according to the present invention. As shown in FIG. 6A, in the embodiment of the sealing apparatus 1 with interlocking air inflation device, the interlocked cam 12 is able to connect and accommodate an interlocking device 3 having an air inflation member 31, wherein when the interlocked device 3 is disposed in the accommodating portion 121 of the interlocked cam 12, the air inflation member 31 can couple to the air intake/outtake valve 15 through the flow channel 123 and the first connecting member 122. Thus, an inflating gas may get into the air intake/outtake valve 15 via the air inflation member 31 of the interlocking device 3, and furthermore, the air intake/outtake valve 15 is able to inflate the air inflation sealing member 14, so as to expand the air inflation sealing member 14. Moreover, as shown in FIG. 6B, the air inflation member 31 includes an extension portion 311, wherein when the air inflation member 31 can extend the extension portion 311 thereof and the extension portion 311 gets into the air intake/outtake valve 15, the air intake/outtake valve 15 would goaded by the extension portion 311 to deflate the air inflation sealing member 14.

Figure 7A:
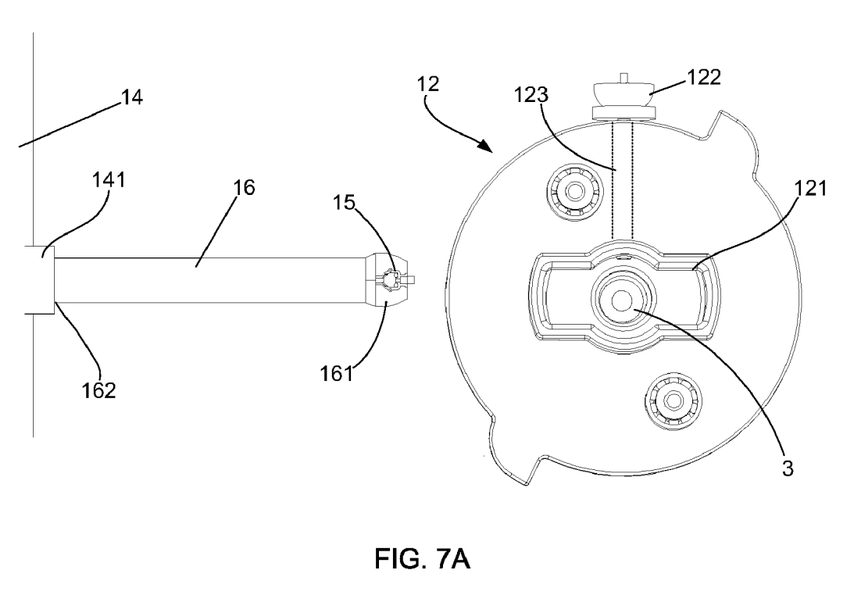
FIG. 7A and FIG. 7B are motion views of the interlocking device driving a interlocked cam to inflate an air inflation sealing member.
Figure 7B:
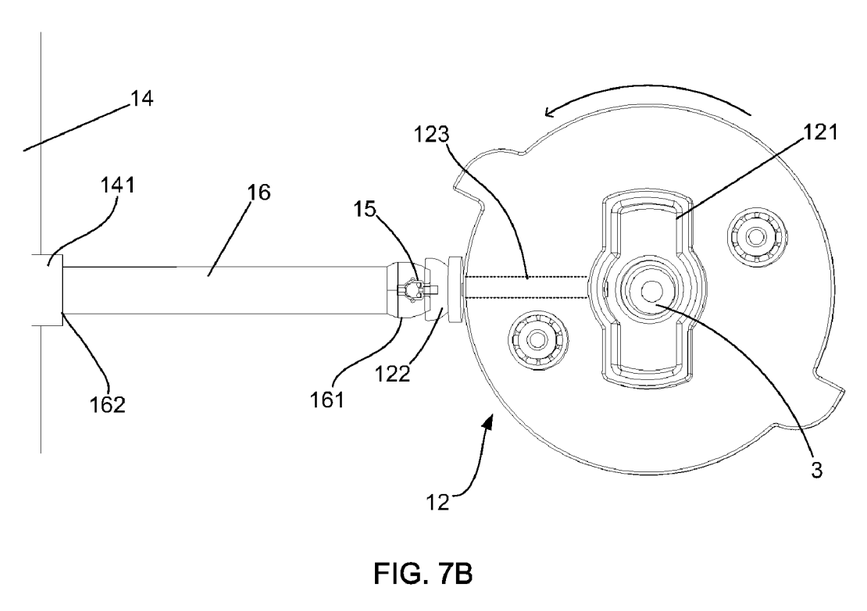
Figure 8A:
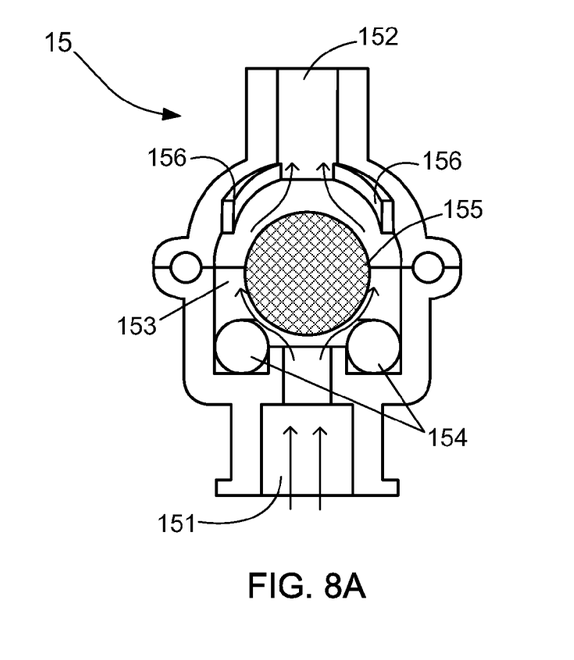
FIG. 8A and FIG. 8B are schematic views of a flow route of an inflating gas flowing in the air intake/outtake valve.
Figure 8B:
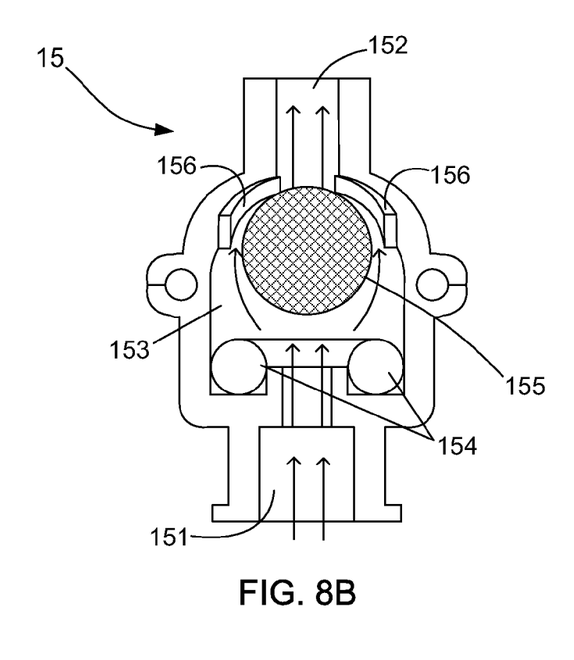

Therefore, through the above descriptions, the exemplary framework of the sealing apparatus with interlocking air inflation device used in the wafer carrier is completely and clearly disclosed. Moreover, in order to more distinctly introduce how the interlocking device 3 driving the interlocked cam 12 to finish the air inflation of the air inflation sealing member 14 when the cover 22 is closed the wafer container 21, in follows, the motion views will be illustrated for detailed explain that. Please refer to FIG. 7A and FIG. 7B, which illustrate the motion views of the interlocking device driving the interlocked cam to inflate the air inflation sealing member. As shown in FIG. 7A, and FIG. 7B, when the cover 22 is closed the wafer container 21 and the interlocking device 3 is disposed into the accommodating portion 121 of the interlocked cam 12, the interlocking device 3 can be used for driving the interlocked cam 12 to counterclockwise rotate a specific angle, so as to make the latch set 11 latch the cover 22 and the wafer container 21, and meanwhile the air inflation member 31 couples to the air intake/outtake valve 15 through the first connecting member 122, therefore, the inflating gas is able to enter the air intake/outtake valve 15 via the air inflation member 31 and the interlocked cam 12, furthermore, the air intake/outtake valve 15 may inflate the air inflation sealing member 14, so as to expand the air inflation sealing member 14;

Continuously refer to FIG. 7A and FIG. 7B, and simultaneously refer to FIG. 8A and FIG. 8B, which illustrate schematic views of a flow route of the inflating gas flowing in the air intake/outtake valve. As shown in FIG. 8A, and FIG. 8B, when the inflating gas enters the air intake/outtake valve 15 through the air inflation member 31 and the interlocked cam 12, the inflating air gets into the central chamber 153 via the first air passage 151; then, the inflating air pushes the sealing ball 155 in the central chamber 153, such that the sealing ball 155 moves toward the second air passage 152; after that, the sealing ball 155 moves to the plurality of ribs 156 located at the connecting junction of the central chamber 153 and the second air passage 152; then, the inflating gas gets into the second air passage 152 along the air-guiding channel formed by any two adjacent ribs 156, and further gets into the second connecting member 141 via the connecting rubber tube 16; and eventually, the inflating gas inflates the air inflation sealing member 14, so as to expand the air inflation sealing member 14.

Thus, through the FIG. 7A, FIG. 7B, FIG. 8A, and FIG. 8B, it is clearly introduced that how to using the interlocking device 3 for driving the interlocked cam 12 to make the latch set 11 latch the cover 22 and the wafer container 21, and to inflate the air inflation sealing member 14 through the interlocking device 3, the interlocked cam 12 and the air intake/outtake valve 15 when the covered and the wafer container 21 are latched, so as to assuredly seal up the cover 22 and the wafer container 21.

Figure 9A:
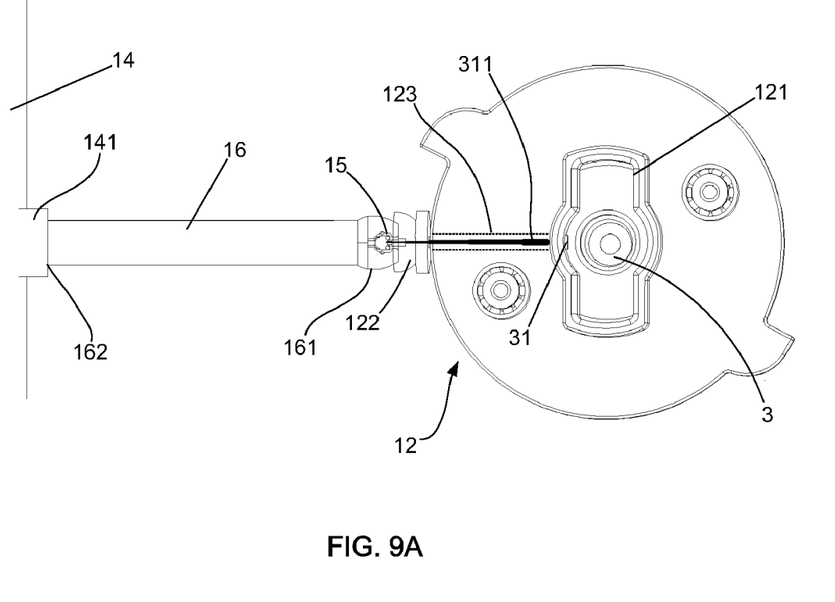
FIG. 9A and FIG. 9B are the motion views of the interlocking device driving the interlocked cam to deflate the air inflation sealing member.
Figure 9B:
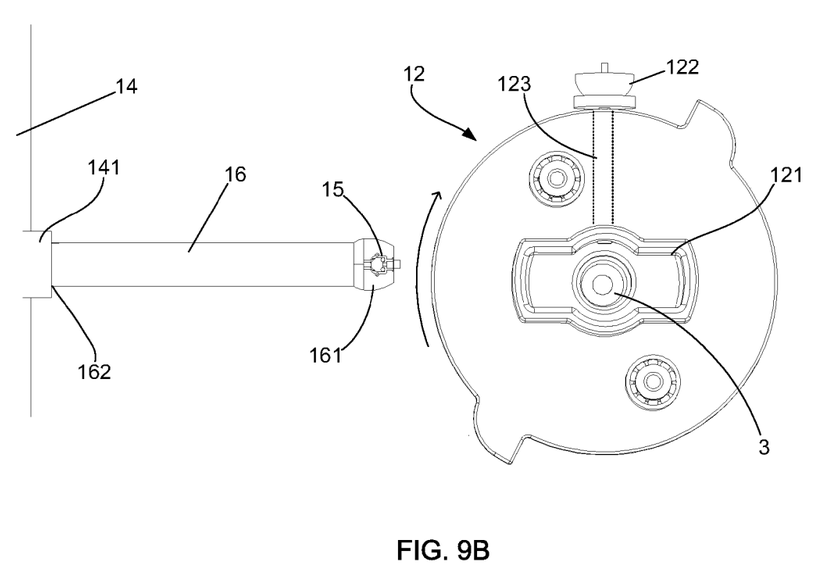

Moreover, for the exemplary framework of the sealing apparatus with interlocking air inflation device, the interlocking device 3, the interlocked cam 12 and the air intake/outtake valve 15 can also be used to deflate the air inflation sealing member 14. Please refer to FIG. 9A and FIG. 9B, which illustrate the motion views of the interlocking device driving the interlocked cam to deflate the air inflation sealing member. As shown in FIG. 9A, and FIG. 9B, when the air inflation sealing member 14 is inflatable and the interlocking device 3 is disposed in the accommodating portion 121 of the interlocked cam 12, the air inflation member 31 is able to extend the extension portion 311 thereof, and make the extension portion 311 get into the air intake/outtake valve 15 via the flow channel 123 of the interlocked cam 12, and then the extension portion 311 would make the air intake/outtake valve 15 deflate the air inflation sealing member 14. Moreover, when the air inflation sealing member 14 is deflated, the air in the air inflation sealing member 14 may flow out of the air inflation sealing member 14 by following two ways: (1) being normally deflated; (2) getting out of the air inflation sealing member 14 by the suction of the air inflation member 31. Besides, after the air deflation of the air inflation sealing member 14 is finished, it can use the interlocking device 3 for deriving the interlocked cam 12 to clockwise rotate the specific angle, so as to open the latch set 11.

Figure 10:
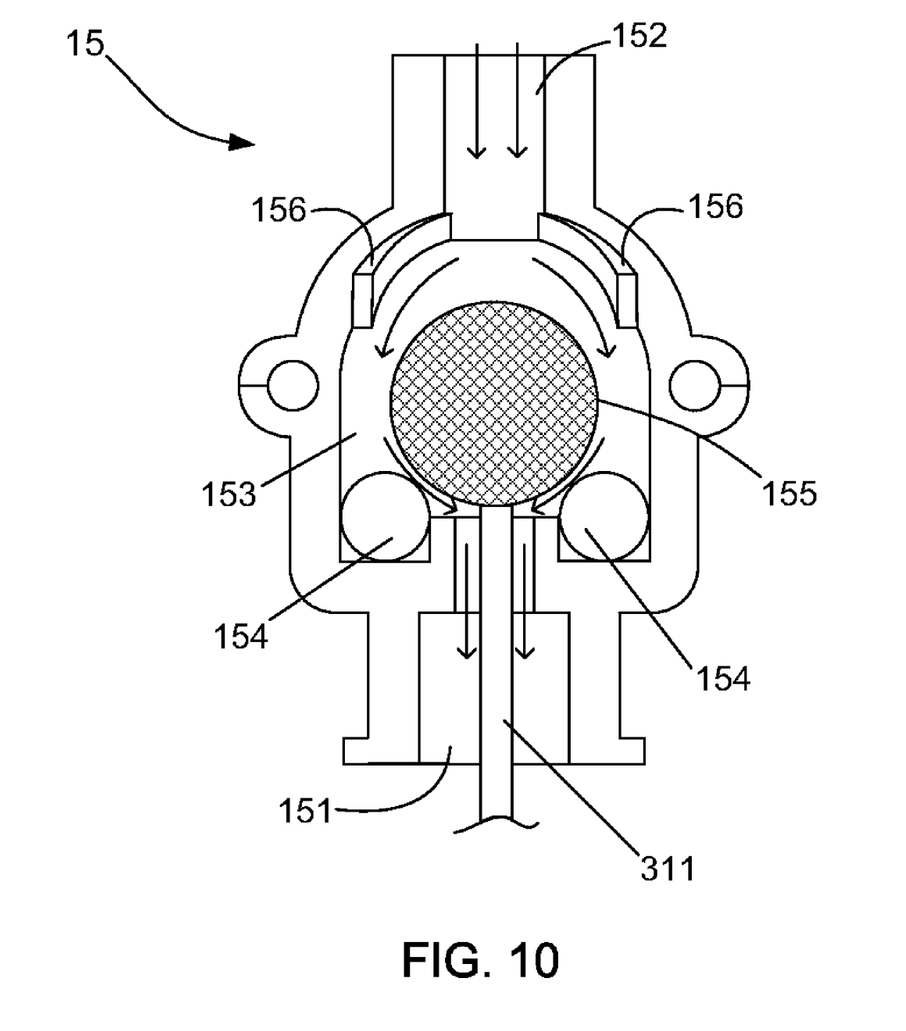
FIG. 10 is the schematic view of the flow route of the inflating gas flowing in the air intake/outtake valve.

Referring to FIG. 9A and FIG. 9B again, and simultaneously referring to FIG. 10, which illustrates the schematic view of the flow route of the inflating gas flowing in the air intake/outtake valve. As shown in FIG. 10, when the air inflation member 31 extends the extension portion 311 thereof into the first air passage 151 of the air intake/outtake valve 15, the extension portion 311 would get into the central chamber 153 via the first air passage 151, and pushes the sealing ball 155 located at the connecting junction of the first air passage 151 and the central chamber 153; meanwhile, the air in the air inflation sealing member 14 can get into the connecting tube 16 through the second connecting member 141, the second air passage 152, the central chamber 153 and the first air passage 151, therefore the air deflation of the air inflation sealing member 14 is finished.

Thus, through the FIG. 2, FIG. 3, FIG. 4, FIG. 5, FIG. 6A, and FIG. 6B, the exemplary framework of the sealing apparatus with interlocking air inflation device of the present invention has been clearly disclosed and introduced; Moreover, FIG. 7A, FIG. 7B, FIG. 8A, FIG. 8B, FIG. 9A, FIG. 9B, and FIG. 10 also distinctly introduce that how the interlocking device driving the interlocked cam to finish the air inflation of the air inflation sealing member when the cover 22 is closed the wafer container 21; So that, in summary, the present invention has the following advantages:

1. The interlocked cam has an accommodating portion capable of connecting and accommodating an interlocking device with an air inflation member, such that the interlocking device is able to drive the interlocking device to rotate, so as to make the latch set latch the wafer container and the cover of wafer carrier.
2. Inheriting to above point 1, moreover, when the latch set latches the cover and the wafer container, an inflating gas can inflate the air inflation sealing member through the air inflation member of the interlocking device, the flow channel and the first connecting member of the interlocked cam.

3. In addition, by way of extending an extension portion of the air inflation member into the air intake/outtake valve and making the extension portion push a sealing ball in the central chamber of the air intake/outtake valve, the air in the air inflation sealing member may get out of the air inflation sealing member via the second air passage, the central chamber and the first air passage, so as to complete the air deflation of the air inflation sealing member.

The above description is made on embodiments of the present invention. However, the embodiments are not intended to limit scope of the present invention, and all equivalent implementations or alterations within the spirit of the present invention still fall within the scope of the present invention.

What is claimed is:

1. A sealing apparatus with an interlocking air inflation device, disposed in a wafer carrier having a wafer container and a cover, wherein the cover is used for closing and opening the wafer container, and the cover and the wafer container can be fastened together through a fastener mechanism, wherein an opening is formed in one side of the wafer container, such that the sealing apparatus is disposed between the opening and the cover for sealing the wafer container and the cover, the sealing apparatus comprises:

at least one latch set, being disposed between an inner surface and an outer surface of the cover;
at least one interlocked cam, being disposed between the inner surface and the outer surface of the cover and connected to the at least one latch set, the interlocked cam having a first connecting member;
an air inflation sealing member, being disposed around the edge of the inner surface of the cover; and
at least one air intake/outtake valve, being coupled to the air inflation sealing member and capable of coupling to the first connecting member of the interlocked cam;
wherein the interlocked cam is adapted for connecting an interlocking device with an air inflation member, when the interlocking device is connected to the interlocked cam, the air inflation member coupling to the air intake/outtake valve via the first connecting member;
wherein when the cover is closed the wafer container and the interlocking device is connected to the interlocked cam, the interlocking device can be controlled for driving the interlocked cam to forwardly rotate a specific angle, so as to make the latch set latch the cover and the wafer container, and meanwhile the air inflation member couples to the air intake/outtake valve through the first connecting member, therefore, an inflating gas being able to enter the air intake/outtake valve via the air inflation member and the interlocked cam, and furthermore, the air intake/outtake valve may inflate the air inflation sealing member, so as to expand the air inflation sealing member;
wherein when the air inflation sealing member is inflatable and the interlocking device is connected to the interlocked cam, the air inflation member being able to extend an extension portion thereof into the air intake/outtake valve, then the extension portion makes the air intake/outtake valve deflate the air inflation sealing member, moreover, after the air inflation sealing member is deflated, the interlocked cam can be driven to reversely rotate the specific angle by the interlocking device for opening the latch set.

2. The sealing apparatus with interlocking air inflation device for the wafer carrier of claim 1, wherein the interlocked cam further comprises:

an accommodating portion, being formed in the center of the interlocked cam, and used for connecting and accommodating the interlocking device; and
a flow channel, being disposed inside the interlocked cam and connecting with the accommodating portion and the first connecting member.

3. The sealing apparatus with interlocking air inflation device for the wafer carrier of claim 2, further comprises at least one connecting rubber tube with a first end and a second end, wherein the first end accommodates the air intake/outtake valve and is used for connecting the first connecting member, the second end being connected to the air inflation sealing member.

4. The sealing apparatus with interlocking air inflation device for the wafer carrier of claim 3, wherein the air inflation sealing member further comprises at least one second connecting member connected to the second end of the connecting rubber rube.

5. The sealing apparatus with interlocking air inflation device for the wafer carrier of claim 2, wherein the air intake/outtake valve further comprises:

a first air passage, capable of coupling to the flow channel for making the inflating gas provided by the air inflation member enter the first air passage via the flow channel;
a central chamber, being connected to the first air passage;
an O-ring, being disposed in the central chamber and located at the connecting junction of the central chamber and the first air passage;
a sealing ball, being disposed in the central chamber and located over the O-ring;
a second air passage, being connected to the central chamber and opposite to the first air passage, used for coupling to the air inflation sealing member;
a plurality of ribs, being disposed in the central chamber and located at the connecting junction of the central chamber and the second air channel, therefore an air-guiding passage being formed between any two adjacent ribs.

6. The sealing apparatus with interlocking air inflation device for the wafer carrier of claim 3, wherein the first connecting member is a circular body, which is able to completely accommodate and cover the first end of the connecting rubber tube.

7. The sealing apparatus with interlocking air inflation device for the wafer carrier of claim 1, wherein the material of the air inflation sealing member is selected from the group consisting of: a polyolefin thermoplastic elastomer, a polyester thermoplastic elastomer and a rubber.

* * * * *